United States Patent [19]
Serizawa

[11] Patent Number: 6,061,287
[45] Date of Patent: May 9, 2000

[54] SEMICONDUCTOR MEMORY DEVICE

[75] Inventor: Kenichi Serizawa, Kanagawa, Japan

[73] Assignee: NEC Corporation, Tokyo, Japan

[21] Appl. No.: 09/256,291

[22] Filed: Feb. 24, 1999

[30] Foreign Application Priority Data

Feb. 27, 1998 [JP] Japan .................................. 10-047398

[51] Int. Cl.[7] .................................................. G11C 7/00
[52] U.S. Cl. ...................................... 365/203; 365/185.09
[58] Field of Search ............................... 365/203, 189.01, 365/189.03, 185.09

[56] References Cited

U.S. PATENT DOCUMENTS

| | | | |
|---|---|---|---|
| 5,600,605 | 2/1997 | Schaefer | 365/203 |
| 5,703,831 | 12/1997 | Sawada | 365/203 |
| 5,818,777 | 10/1998 | Seyyedy | 365/222 |

FOREIGN PATENT DOCUMENTS

| | | |
|---|---|---|
| 6-005081 | 1/1994 | Japan . |
| 7-192473 | 7/1995 | Japan . |
| 7-220477 | 8/1995 | Japan . |

*Primary Examiner*—David Nelms
*Assistant Examiner*—Anh Phung
*Attorney, Agent, or Firm*—McGinn & Gibb, P.C.

[57] ABSTRACT

A semiconductor memory device includes a memory cell array, a read/write control circuit, a signal generator, and a write error prevention circuit. In the memory cell array, a plurality of memory cells are formed at intersections of pluralities of word lines and bit lines. The read/write control circuit controls a data read/write from/in the memory cell array in accordance with a mode setting signal representing a read/write mode, a data input signal, and an address signal. The signal generator generates a one-shot pulse signal when the mode setting signal represents a write mode. The write error prevention circuit precharges a bit line of the memory cell array by the one-shot pulse signal from the signal generator.

9 Claims, 11 Drawing Sheets

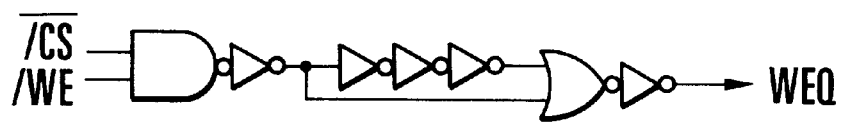
F I G. 4 A
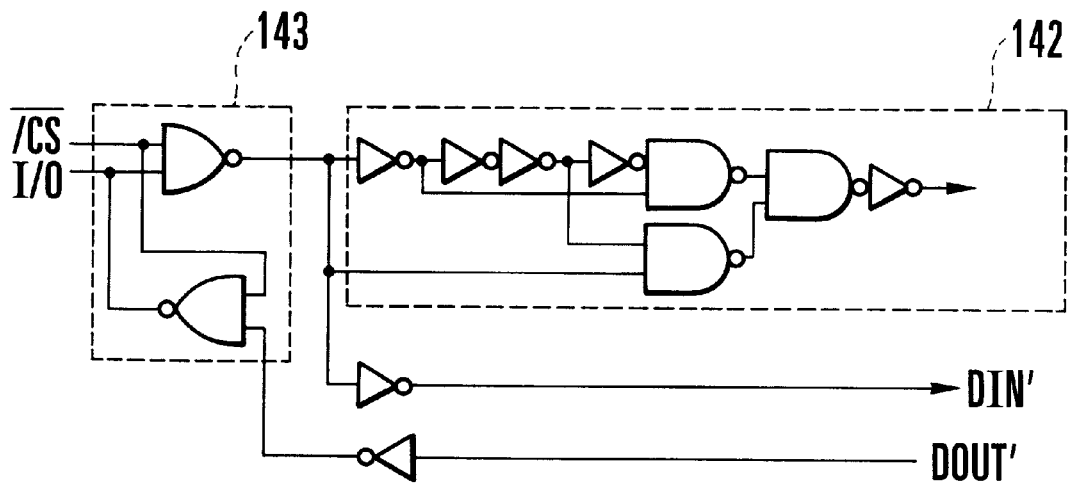
F I G. 4 B

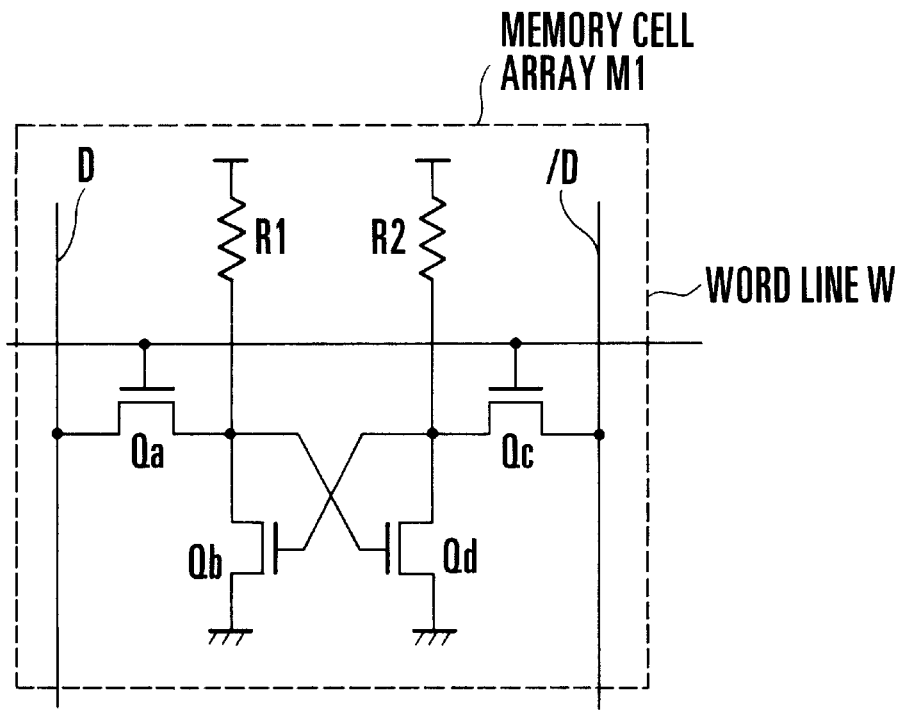
F I G. 9
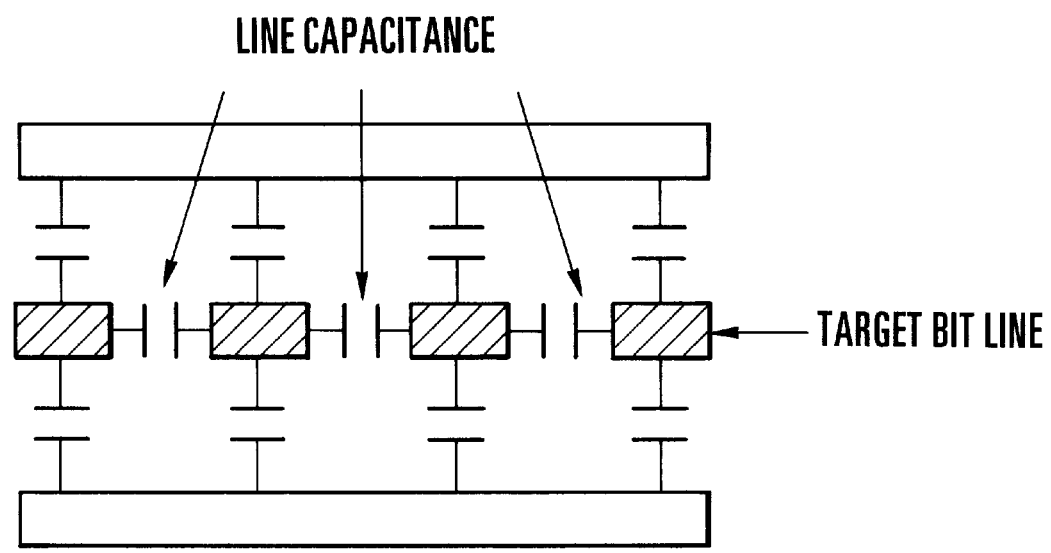
F I G. 10

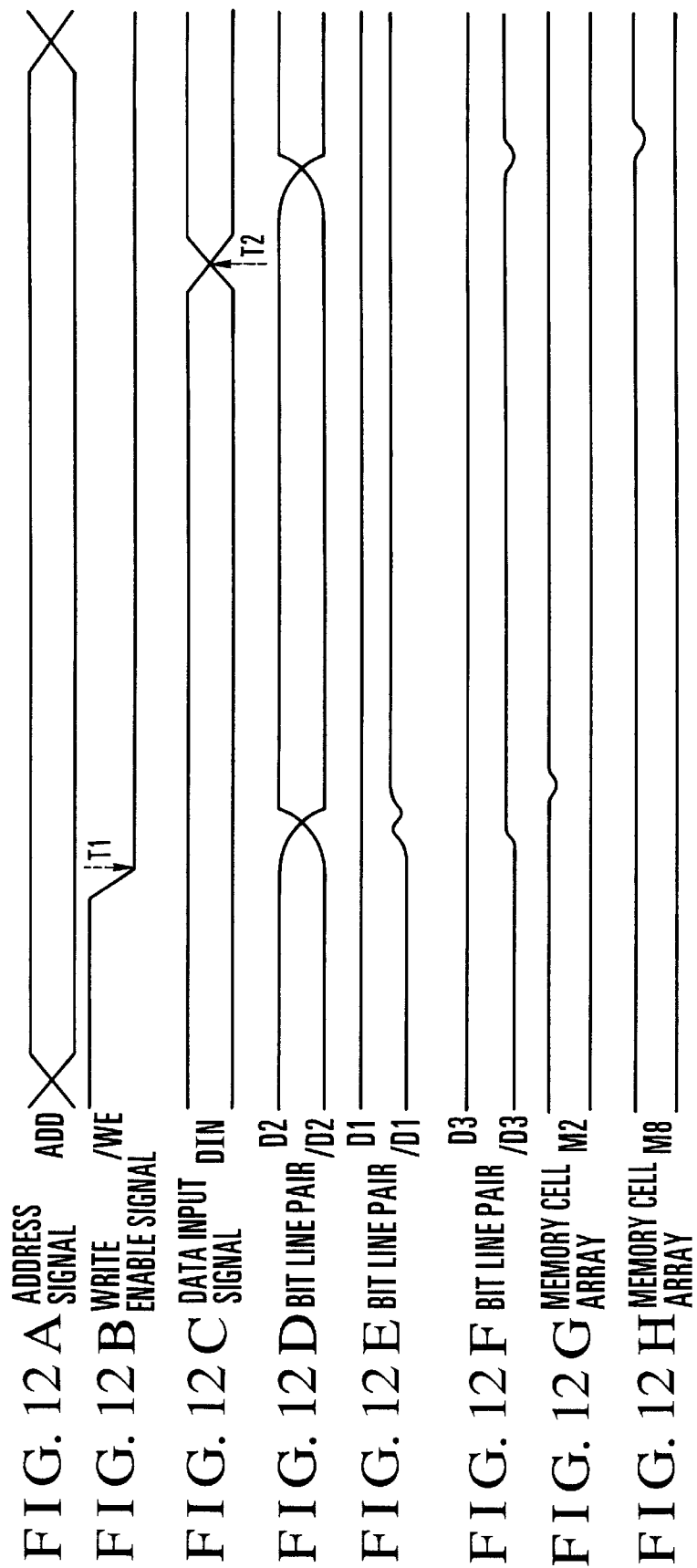

SEMICONDUCTOR MEMORY DEVICE

BACKGROUND OF THE INVENTION

The present invention relates to a semiconductor memory device and, more particularly, to a circuit for preventing a memory cell write error in an SRAM (Static Random Access Memory).

FIG. 6 shows a general SRAM 20.

In FIG. 6, in order to access a memory cell of a memory cell array 1, an address signal ADD is input to an address buffer 2, and the address buffer 2 supplies address values to column and row address decoders 3 and 4. The column address decoder 3 decodes the supplied address value to output a selection signal 12 for selecting one word line to the memory cell array 1. The row address decoder 4 decodes the supplied address value to output a selection signal 13 for selecting a bit line pair to a bit line controller 5.

The bit line controller 5 connects the selected bit line pair to a data input or output buffer 6 or 7 in response to the signal from the row address decoder 4. In the arrangement shown in FIG. 6, a signal for externally inputting/outputting data also serves as an I/O signal. A precharge circuit 8 charges a bit line pair to a predetermined potential in accordance with an equalization signal EQ generated by an address transfer detector (ATD) 9 in a read from a memory cell.

Reference symbol /WE denotes a write/read mode setting signal (to be referred to as a write enable signal) which represents a read mode at high level, and a write mode at low level; and /CS, a chip selection signal which activates the SRAM 20 at low level, and inactivates the SRAM 20 at high level.

When the SRAM 20 is mounted on one chip, the address signal ADD, the data input/output signal I/O, the write enable signal /WE, and the chip selection signal /CS are input outside the chip.

FIG. 7 shows the memory cell array 1, the bit line controller 5, and the precharge circuit 8. The bit line controller 5 generally includes a sense amplifier, write buffer, and the like, but only a column switch is illustrated in the controller 5 in FIG. 7 for descriptive convenience. FIG. 9 shows the arrangement of a memory cell M1. Memory cells M1 to M12 have the same arrangement.

The memory cell array 1 comprises a plurality of word lines W1, W2, . . . , Wn (to be referred to as Wn), pairs of bit lines D1 and /D1, D2 and /D2, . . . , Dn and /Dn (to be referred to as Dn and /Dn) perpendicular to the word lines Wn, and the memory cells M1, M2, . . . , M12 formed at intersections of the word lines Wn and the pairs of bit lines Dn and /Dn. The precharge circuit 8 is constituted by sets of three p-type (p-channel) transistors Q1, Q2, and Q3, Q4, Q5, and Q6, . . . , Q10, Q11, and Q12 in units of bit line pairs, and each set of three transistors is connected to one terminal of the pair of bit lines Dn and /Dn. The other terminal of the pair of bit lines Dn and /Dn is connected to the above-described bit line controller 5.

The word line Wn is connected to the column address decoder 3 shown in FIG. 6 and receives the word line selection signal 12. The bit line controller 5 connects the selected pair of bit lines Dn and /Dn to internal data buses DB and /DB, respectively, in response to the bit line selection signal 13 from the row address decoder 4. The internal data buses DB and /DB are respectively connected as data input and output signals DIN and DOUT to the data input and output buffers 6 and 7 in FIG. 6. As shown in FIG. 9, each of the memory cells M1 to M12 is made up of load resistors R1 and R2, and four n-type transistors Qa to Qd.

In the memory array having the arrangement shown in FIG. 6, data held by the memory cells M1 to M12 between adjacent bit line pairs are undesirably inverted by parasitic capacitances (to be referred to as line capacitances C1, C2, . . . , Cn) between the parallel pairs of bit lines Dn and /Dn in a write to the memory cells M1 to M12. This phenomenon will be called "a write error" of the memory cell and explained with reference to timing charts in FIGS. 8A to 8H.

First, the initial write states of the memory cells M1 to M12 in the memory cell array of FIG. 7 are assumed as follows:

Memory cell M1: D1-side potential is at high level, and /D1-side potential is at low level.

Memory cell M2: D1-side potential is at low level, and /D1-side potential is at high level.

Memory cell M4: D2-side potential is at high level, and /D2-side potential is at low level.

Memory cell M7: D3-side potential is at low level, and /D3-side potential is at high level.

Memory cell M8: D3-side potential is at high level, and /D3-side potential is at low level.

More specifically, assume that "1"s are written in the memory cells M1, M4, and M8, and "0"s are written in the memory cells M2 and M7, respectively. A description of the write states of the remaining memory cells will be omitted for convenience. A target write memory cell is M4. In the following description, "high level" means a power supply potential, and "low level" means a ground potential (0 V).

When the address signal ADD changes (FIG. 8A), the word line W1 corresponding to the memory cell M4 is selected to high level, and other word lines W2 and W3 are kept unselected at low level. The pairs of bit lines D2 and /D2 corresponding to the memory cell M4 is selected.

Since the word line W1 is selected by the address signal ADD before the write enable signal /WE shown in FIG. 8B changes to a write mode (low level), the bit lines D1 and /D1 are respectively at high and low levels in accordance with the write state of the memory cell M1 (FIG. 8E). Similarly, the bit lines D2 and /D2 are respectively at high and low levels in accordance with the write state of the memory cell M4 (FIG. 8D). The bit lines D3 and /D3 are respectively at low and high levels in accordance with the write state of the memory cell M7 (FIG. 8F).

If the value held by the data input buffer 6 is "0", when the write enable signal /WE changes to low level to set a write mode (timing T1 in FIG. 8B), the internal data bus DB which is outputting read data "1" changes from high level to low level, and /DB changes from low level to high level. The bit line D2 changes from high level to low level, and the bit line /D2 changes from low level to high level (FIG. 8D).

The value "0" of the data input signal DIN at timing T1 shown in FIG. 8C is not a value to be written in the memory cell M4, but a value left in a previous write. A value to be written in the memory cell M4 is input to the data input buffer 6 at timing T2. If this value is "1", the potentials of the bit lines D2 and /D2 are inverted again (FIG. 8D). Then, a write to the memory cell M4 is complete.

At timing T1, the bit line /D1 falls to a potential lower than the low level, i.e., a negative potential by the line capacitance C2 under the influence of a change of the bit line D2 from high level to low level, as shown in FIG. 8E. This may invert data of the unselected memory cell M2, as shown in FIG. 8G.

Operation of the memory cell M2 at this time will be explained with reference to FIG. 9. Although the gate potential of the transistor Qc in the memory cell M2 is at low level, the bit line /D1 falls to a negative potential exceeding the threshold voltage, thereby turning on the transistor Qc. The memory cell M2 changes from high level as the initial potential of the bit line /D1 side to low level to invert data of the memory cell M2.

Similarly, at timing T2, data of the memory cell M8 may be inverted as shown in FIG. 8H. That is, D3 falls to a potential lower than the low level, i.e., a negative potential by the line capacitance C4 under the influence of a change of the bit line /D2 from high level to low level, thus inverting data of the memory cell M8.

As described above, a write to the memory cell M4 may cause write errors in the memory cells M2 and M8 connected to the adjacent pairs of bit lines D1 and /D1 and D3 and /D3.

Various parasitic capacitances accompany the bit line and are shown in FIG. 10. FIG. 10 shows the schematic section of the bit line. The parasitic capacitances include the parasitic capacitance of each bit line, and the parasitic capacitances between upper and lower interconnections and a substrate and between bit lines. When a parasitic capacitance between adjacent bit lines is larger than those of the upper and lower bit lines, a write error more likely occurs.

A technique for preventing this write error is disclosed in Japanese Patent Laid-Open No. 7-192473. A conventional write error prevention circuit will be described with reference to FIGS. 11 and 12A to 12H. The same reference numerals as in FIGS. 7 and 8A to 8H denote the same parts, and a description thereof will be omitted. Assume that the initial states of respective memory cells and a data input buffer 6, and a target write memory cell are also the same as in FIGS. 7 and 8A to 8H for the sake of descriptive convenience.

In an SRAM in FIG. 11, a write error prevention circuit 10 is arranged between a memory cell array 1 and a precharge circuit 8. The write error prevention circuit 10 is constituted by n-type transistors Q13 and Q14, Q15 and Q16, . . . , Q19 and Q20 formed in units of bit line pairs, and a p-type transistor Q21. The n-type transistors Q13 to Q20 have gates and drains connected to the drain of the p-type transistor Q21 via a charge control line 10a, and sources connected to respective bit lines. The gate of the p-type transistor Q21 receives the write enable signal /WE.

Operation of the conventional SRAM having this arrangement will be described with reference to FIGS. 12A to 12H.

Similar to FIG. 7, when the write enable signal /WE changes from high level to low level at timing T1 in FIG. 12B, the SRAM changes from a read mode to a write mode. The p-type transistor Q21 is turned on to charge the drains and gates of the n-type transistors Q13 to Q20 to high level via the charge control line 10a and turn on the transistors Q13 to Q20. Then, the low-level potential of each pair of bit lines Dn and /Dn is charged. The charge potential is determined by the abilities of the n-type transistors Q13 to Q20.

At the same time as this charge, the internal data buses DB and /DB change to change the bit line D2 from high level to low level and the bit line /D2 from low level to high level (FIG. 12D). In the circuit of FIG. 7, the bit line /D1 falls to a negative potential under the influence of the line capacitance C2. However, this conventional circuit prevents the bit line /D1 from falling to a negative potential by slightly precharging the bit line /D1 (FIG. 12E).

Since charge continues while the write enable signal /WE is at low level, the bit line D3 is prevented from falling to a negative potential (FIG. 12F) when the data input signal DIN to be written in the memory cell M4 is confirmed (at timing T2 in FIG. 12C).

Since the bit lines /D1 and D3 do not fall to a negative potential at timings T1 and T2, no write error occurs in the adjacent memory cells M2 and M8 (FIGS. 12G and 12H).

In the circuit of FIG. 7, a write error is generated in a write to a memory cell. In the circuit of FIG. 11 which solves this problem, the pair of bit lines Dn and /Dn is being charged while the write enable signal /WE is generated. More specifically, since the n-type transistors Q13 to Q20 and the p-type transistor Q21 are always ON during a memory cell write mode, a stationary current flows through the write error prevention circuit 10 and the pair of bit lines Dn and /Dn to increase the power consumption.

SUMMARY OF THE INVENTION

It is an object of the present invention to provide a semiconductor memory device which prevents a write error to an adjacent memory cell in a write to a memory cell array.

It is another object of the present invention to provide a semiconductor memory device which reduces the power consumption for preventing a write error.

To achieve the above objects, according to the present invention, there is provided a semiconductor memory device comprising a memory cell array in which a plurality of memory cells are formed at intersections of pluralities of word lines and bit lines, a read/write control circuit for controlling a data read/write from/in the memory cell array in accordance with a mode setting signal representing a read/write mode, a data input signal, and an address signal, a signal generator for generating a one-shot pulse signal when the mode setting signal represents a write mode, and a write error prevention circuit for precharging a bit line of the memory cell array by the one-shot pulse signal from the signal generator.

BRIEF DESCRIPTION OF THE DRAWINGS

FIGS. 4A and 4B are circuit diagrams of a one-shot pulse generator shown in FIG. 1;

FIG. 9 is a circuit diagram of the memory cell shown in FIG. 7;

FIG. 10 is a view for explaining the line capacitance between bit lines;

FIGS. 12A to 12H are timing charts showing a write in the SRAM shown in FIG. 11.

DESCRIPTION OF THE PREFERRED EMBODIMENTS

The present invention will be described in detail below with reference to the accompanying drawings.

Figure 1:
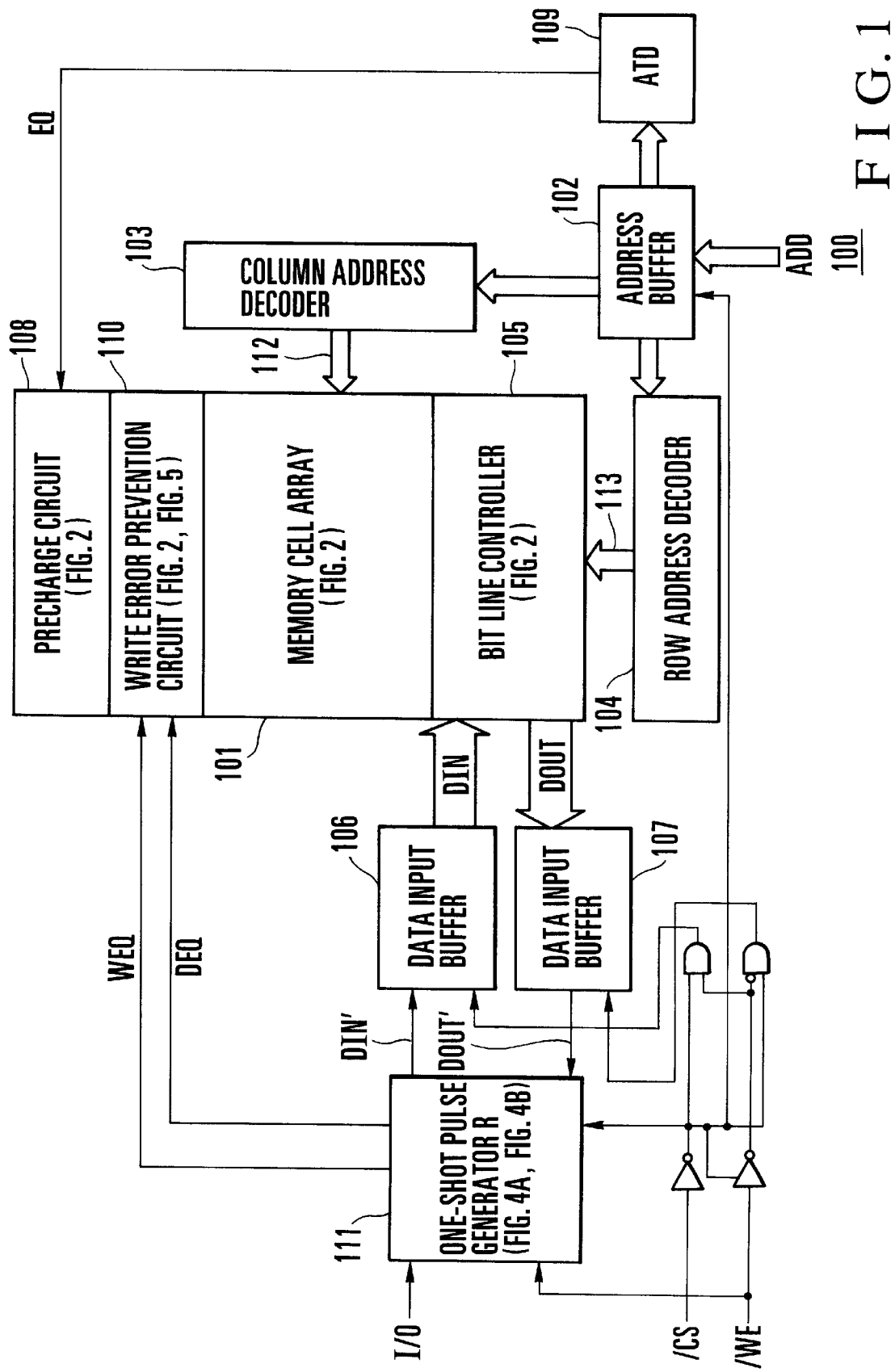
FIG. 1 is a block diagram of an SRAM according to the first embodiment of the present invention.

FIG. 1 shows an SRAM according to the present invention. In FIG. 1, in order to access a memory cell of a memory cell array 101, an address signal ADD is input to an address buffer 102, and the address buffer 102 supplies address values to column and row address decoders 103 and 104. The column address decoder 103 decodes the supplied address value to output a selection signal 112 for selecting one word line to the memory cell array 101. The row address decoder 104 decodes the supplied address value to output a selection signal 113 for selecting a bit line pair to a bit line controller 105.

The bit line controller 105 connects the selected bit line pair to a data input or output buffer 106 or 107 in response to the signal from the row address decoder 104. In the arrangement shown in FIG. 1, a signal for externally inputting/outputting data also serves as an I/O signal. A precharge circuit 108 charges a bit line pair to a predetermined potential in accordance with an equalization signal EQ generated by an address transfer detector (ATD) 109 in a read from a memory cell.

A write error prevention circuit 110 precharges bit lines Dn and /Dn in a write to the memory cell array 101 to prevent inversion of data held in a memory cell of a bit line pair adjacent to a written memory cell.

A one-shot pulse generator 111 receives a chip selection signal /CS, a write enable signal /WE, and a data input signal DIN, and supplies a one-shot pulse signal to the memory cell array 101 in a write in the SRAM 100. A write is performed when the write enable signal represents a write mode and the data input signal DIN is confirmed. In the first embodiment, the one-shot pulse generator 111 generates one-shot pulse signals WEQ and DEQ at these two timings.

The write enable signal /WE indicating write/read mode setting represents a read mode at high level and a write mode at low level. The chip selection signal /CS activates an SRAM 100 at low level and inactivates it at high level.

The address buffer 102, column address decoder 103, row address decoder 104, bit line controller 105, data input buffer 106, data output buffer 107, and precharge circuit 108 constitute a read/write control circuit. When the SRAM 100 is mounted on one chip, the address signal ADD, the data input/output signal I/O, the write enable signal /WE, and the chip selection signal /CS are input outside the chip.

Figure 2:
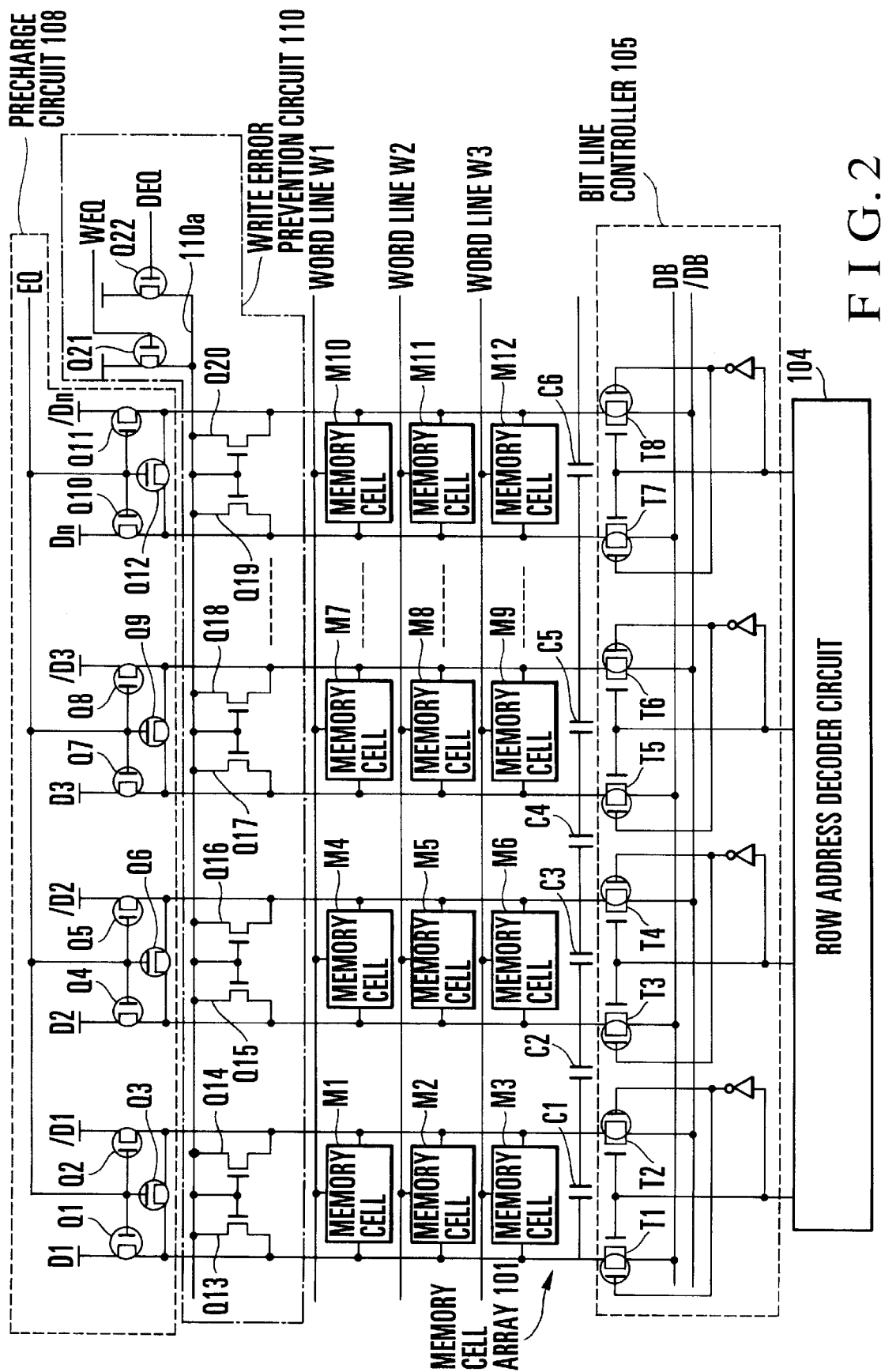
FIG. 2 is a circuit diagram of the main part of the SRAM shown in FIG. 1.

FIG. 2 shows the memory cell array 101, the bit line controller 105, the precharge circuit 108, and the write error prevention circuit 110. The bit line controller 105 generally includes a sense amplifier, write buffer, and the like, but only a column switch is illustrated in the controller 105 in FIG. 2 for descriptive convenience.

The memory cell array 101 comprises a plurality of word lines W1, W2, . . . , Wn (to be referred to as Wn), pairs of bit lines D1 and /D1, D2 and /D2, . . . , Dn and /Dn (to be referred to as Dn and /Dn) perpendicular to the word lines Wn, and memory cells M1, M2, . . . , M12 which are formed with the arrangement shown in FIG. 9 at intersections of the word lines Wn and the pairs of bit lines Dn and /Dn. The precharge circuit 108 is constituted by sets of three p-type (p-channel) transistors Q1, Q2, and Q3, Q4, Q5, and Q6, . . . , Q10, Q11, and Q12 in units of bit line pairs, and each set of three transistors is connected to one terminal of the pair of bit lines Dn and /Dn. The other terminal of the pair of bit lines Dn and /Dn is connected to the bit line controller 105.

The word line Wn is connected to the column address decoder 103 shown in FIG. 1 and receives the word line selection signal 112. The bit line controller 105 connects the selected pair of bit lines Dn and /Dn to internal data buses DB and /DB, respectively, in response to the bit line selection signal 113 from the row address decoder 104. The internal data buses DB and /DB are respectively connected as data input and output signals DIN and DOUT to the data input and output buffers 106 and 107 in FIG. 1.

The write error prevention circuit 110 is constituted by n-type transistors Q13 and Q14, Q15 and Q16, . . . , Q19 and Q20 formed in units of bit line pairs, and p-type transistors Q21 and Q22, and is controlled by the one-shot pulse signals WEQ and DEQ. The n-type transistors Q13 to Q20 have gates and drains connected to the drains of the p-type transistors Q21 and Q22 via a charge control line 110a, and sources connected to respective bit lines. The gate of the p-type transistor Q21 receives the one-shot pulse signal WEQ, and the gate of the p-type transistor Q22 receives the one-shot pulse signal DEQ.

FIGS. 3A to 3J show the timings of the SRAM having this arrangement. Also in the following description, the initial states of the memory cells M1 to M12 and the data input buffer 106, and a target write memory cell are the same as in FIGS. 7 and 8A to 8H.

When the address signal ADD changes (FIG. 3A), the word line W1 corresponding to the memory cell M4 is selected to high level, and other word lines W2 and W3 are kept unselected at low level. The pair of bit lines D2 and /D2 corresponding to the memory cell M4 is selected.

Figure 3:
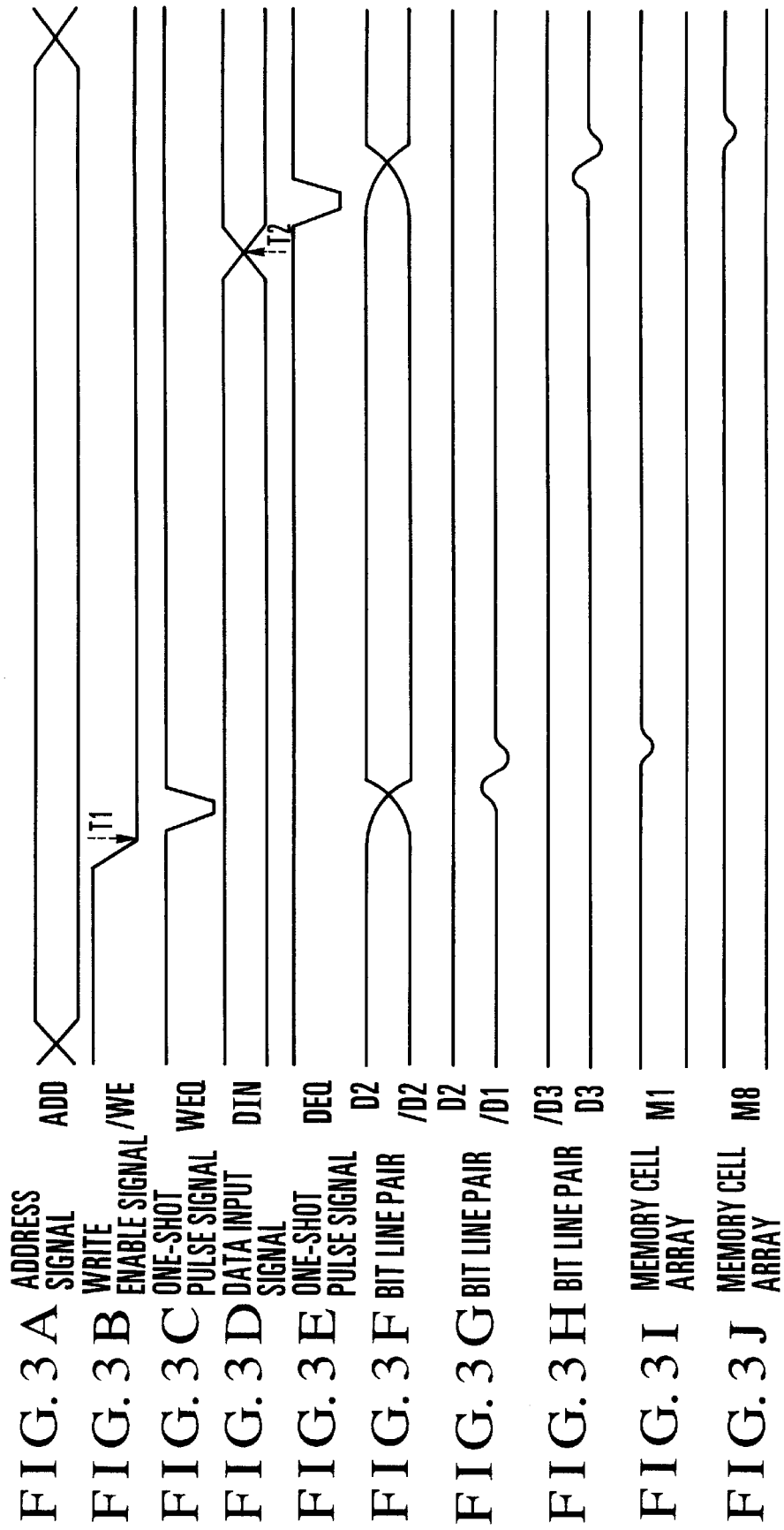
FIGS. 3A to 3J are timing charts showing a write in the SRAM shown in FIGS. 1 and 2.

When the write enable signal /WE changes to low level to set the SRAM 100 to a write mode (timing T1 in FIG. 3B), and the value of the data input signal DIN changes (timing T2 in FIG. 3D), the one-shot pulse signals WEQ and DEQ are generated as shown in FIGS. 3C and 3E.

At timing T1, the one-shot pulse signal WEQ turns on the p-type transistor Q21 to charge the low-level potential of each pair of bit lines Dn and /Dn. At almost the same as this charge, the internal data buses DB and /DB change owing to the difference between the values respectively held by the memory cell M4 and the data input buffer 106. As shown in FIG. 3F, the bit line D2 changes from high level to low level, and the bit line /D2 changes from low level to high level. Since the bit line /D1 is slightly precharged, it can be prevented from falling to a negative potential, as shown in FIG. 3G.

Also, when the data input signal DIN to be written in the memory cell M4 is confirmed, the one-shot pulse signal DEQ is generated to charge the low-level potential of each pair of bit lines Dn and /Dn. At timing T2, the bit line D3 can be prevented from falling to a negative potential, as shown in FIG. 3H.

Since the bit lines /D1 and D3 do not fall to a negative potential at timings T1 and T2, no write error occurs in the adjacent memory cells M2 and M8 (FIGS. 3I and 3J).

The charge potential of each bit line charged by the one-shot pulse signals WEQ and DEQ is determined by the abilities of the n-type transistors Q13 to Q20. For example, when the first embodiment is applied to a 1-M SRAM, and a power supply potential Vcc is about 7 V, the charge potential is about 0.5 V. The one-shot pulse signals WEQ and DEQ have a pulse width of about 10 ns.

FIG. 4A shows a one-shot pulse signal WEQ generator in the one-shot pulse generator 111 in FIG. 1, and FIG. 4B shows a one-shot pulse signal DEQ generator.

In FIG. 4A, a one-shot pulse signal WEQ generator 141 receives an inverted signal of the chip selection signal ICS and the write enable signal /WE shown in FIG. 1. When the write enable signal /WE changes from high level to low level, the one-shot pulse signal WEQ generator 141 generates the one-shot pulse signal WEQ. The pulse width of the one-shot pulse signal WEQ is adjusted by the number of inverters.

A one-shot pulse signal DEQ generator 142 receives an inverted signal of the chip selection signal /CS shown in FIG. 1 and the I/O signal shown in FIG. 1. When a data value input to the I/O signal changes, the one-shot pulse signal DEQ generator 142 generates the one-shot pulse signal DEQ. That is, when the I/O signal changes from high level to low level and from low level to high level, the one-shot pulse signal DEQ generator 142 generates the one-shot pulse signal DEQ.

Figure 6:
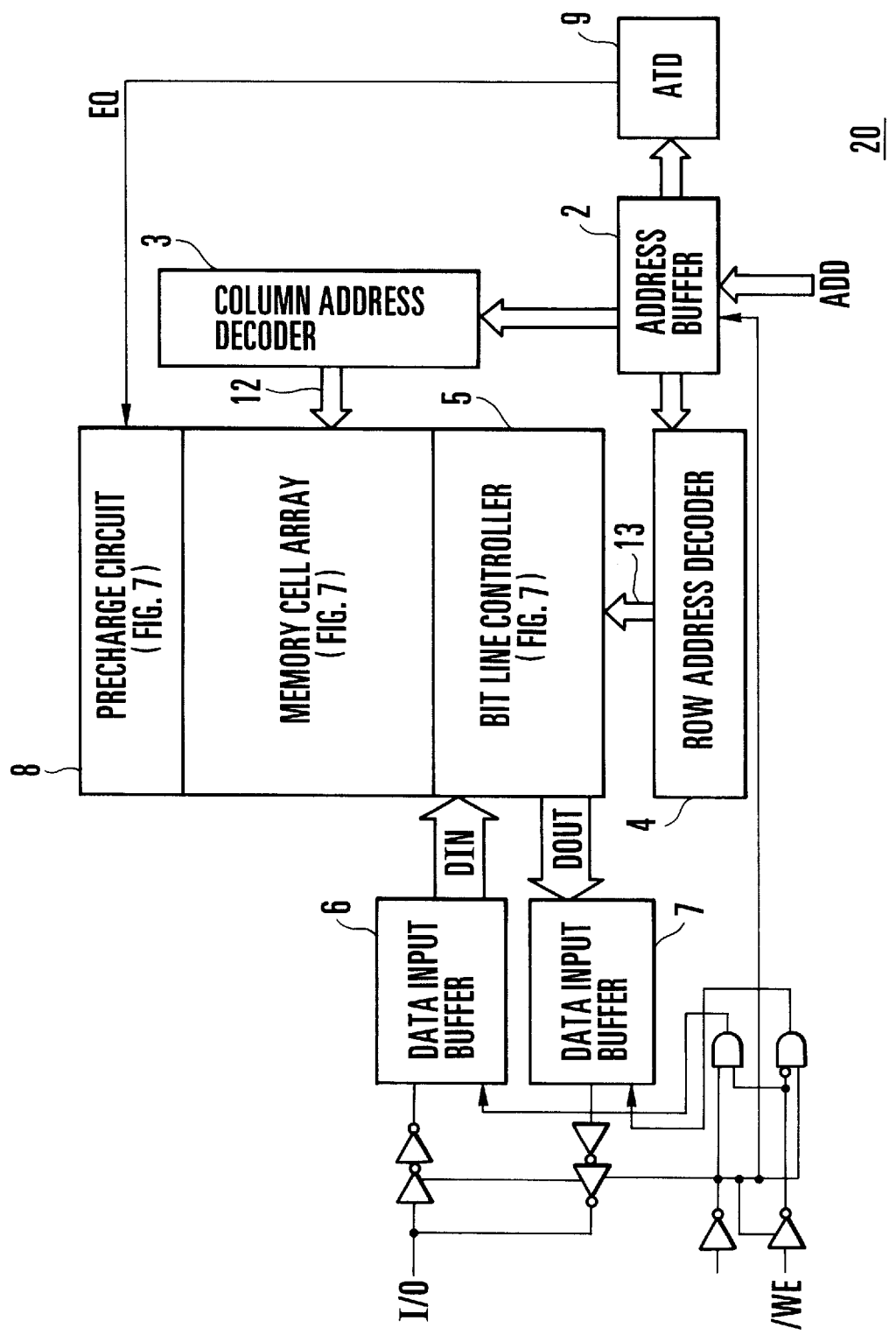
FIG. 6 is a block diagram of a general SRAM.
Figure 7:
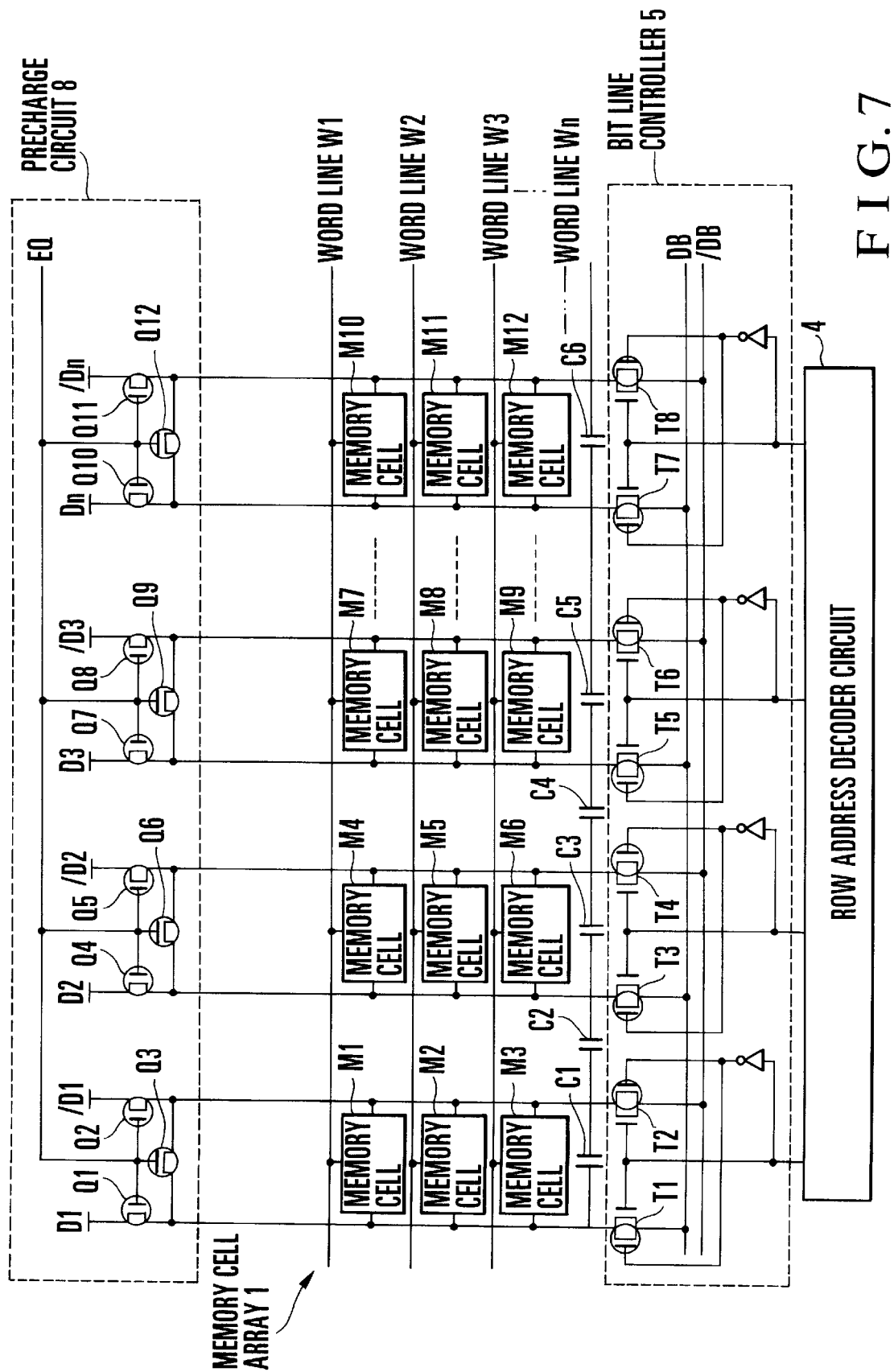
FIG. 7 is a circuit diagram of the main part of the SRAM shown in FIG. 6.
Figure 8:
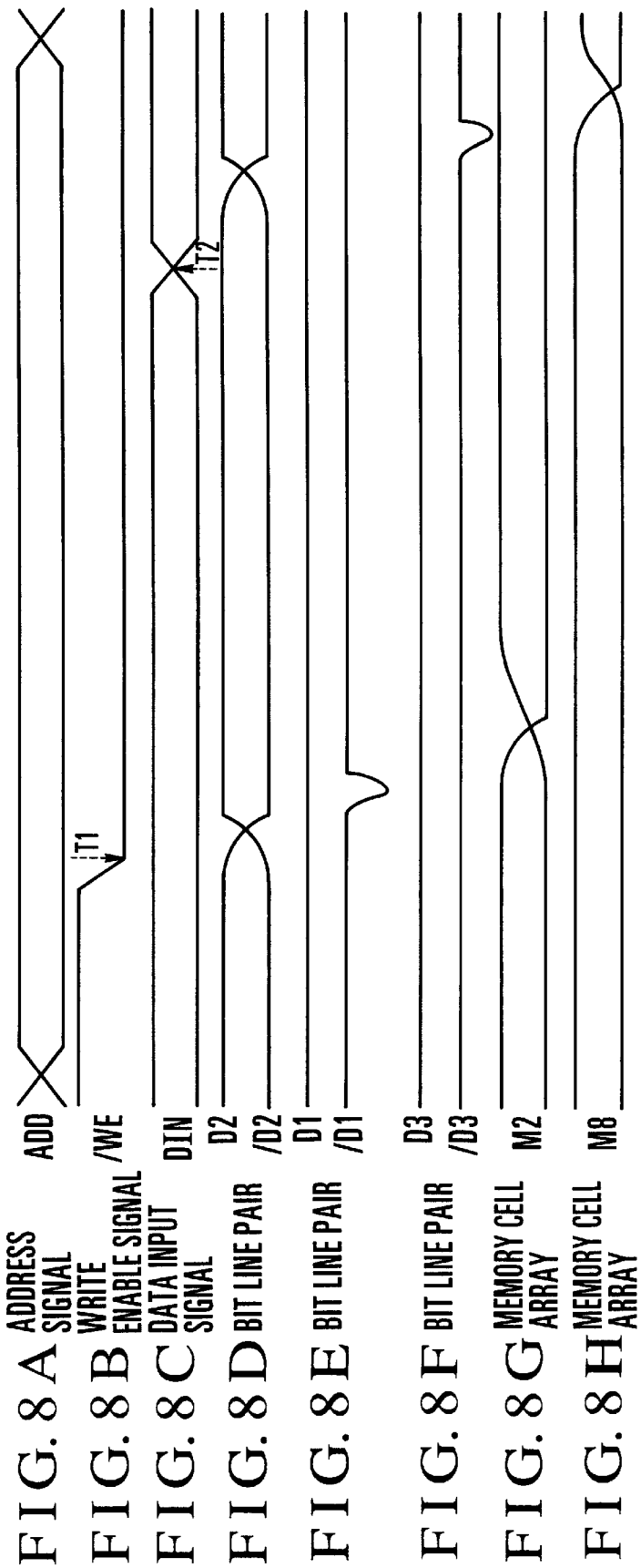
FIGS. 8A to 8H are timing charts showing a write in the SRAM shown in FIGS. 6 and 7.
Figure 11:
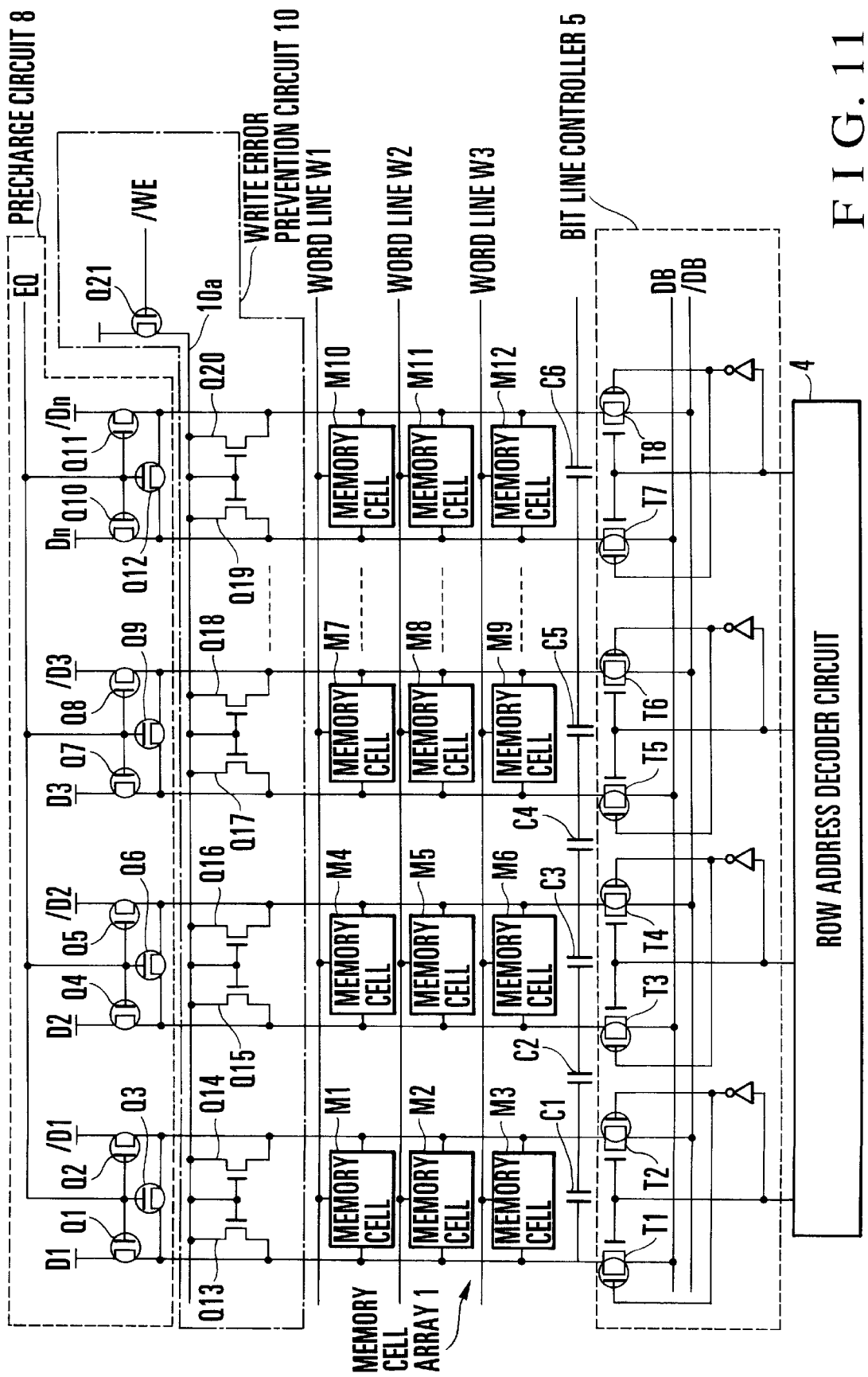
FIG. 11 is a circuit diagram of the main part of a conventional SRAM having a write error prevention circuit.

As shown in FIG. 1, reference symbol DIN' denotes a signal input to the data input buffer 106; and DOUT', a signal output from the data output buffer 107. As is apparent from FIG. 4B, a gate circuit 143 functions as two clocked inverters for inputting/outputting the I/O signal shown in FIG. 6. In other words, when the chip select signal /CS changes to low level, data can be input/output.

Figure 5:
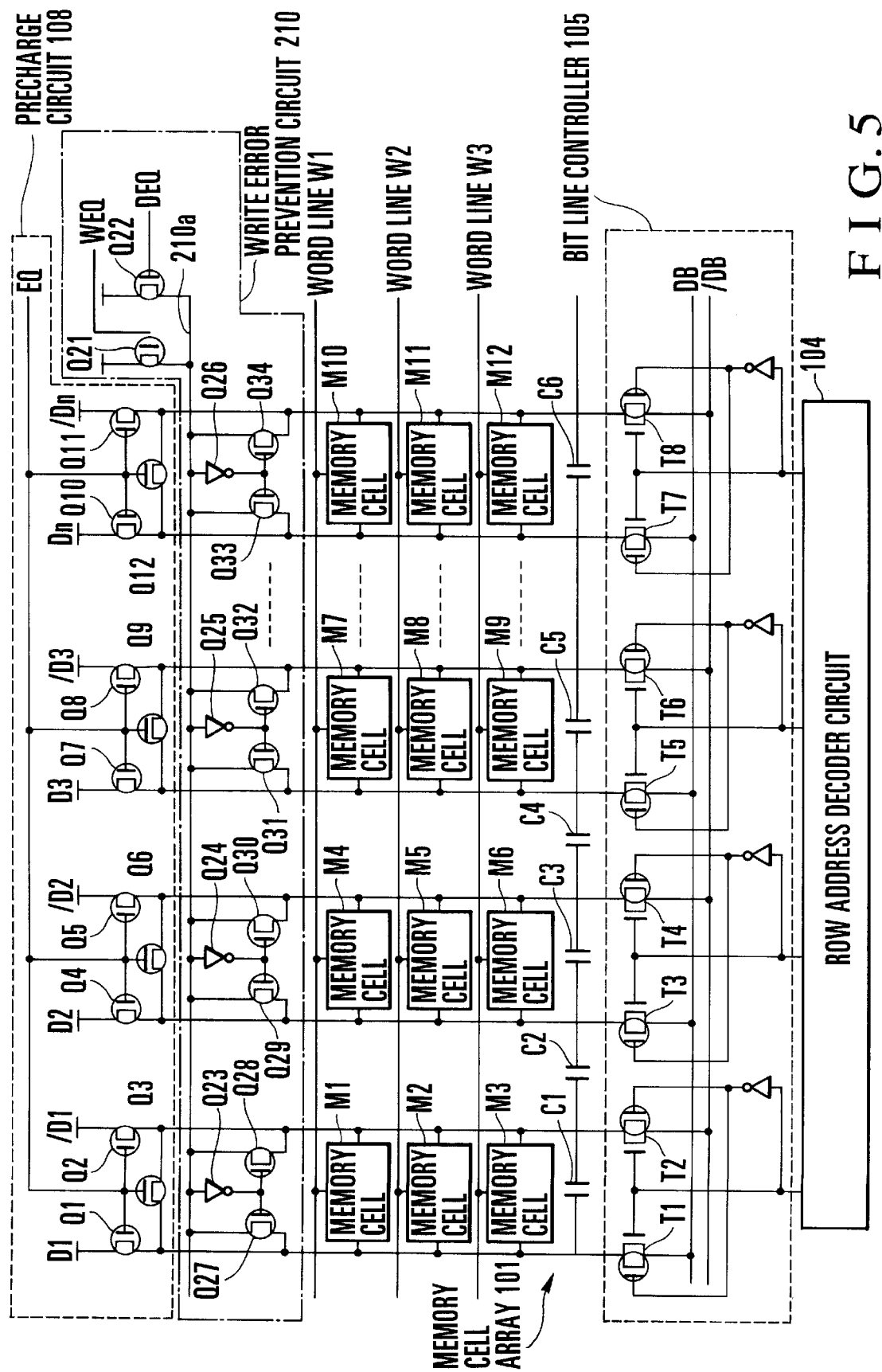
FIG. 5 is a circuit diagram of the main part of an SRAM according to the second embodiment of the present invention.

FIG. 5 shows a memory cell array according to the second embodiment of the present invention. The second embodiment has the same arrangement as the first embodiment except for the write error prevention circuit. The same reference numerals denote the same parts, and a description thereof will be omitted.

In FIG. 5, a write error prevention circuit 210 is constituted by p-type transistors Q27, Q28; Q29, Q30; . . . ; Q33, Q34 formed in units of bit lines, inverters Q23 to Q26 formed in units of bit lines, and p-type transistors Q21 and Q22. The p-type transistors Q27 to Q34 have sources connected to the drains of the p-type transistors Q21 and Q22 via a charge control line 110a, and drains connected to respective bit lines.

The gates of the p-type transistors Q27 to Q34 are connected to the drains of the p-type transistors Q21 and Q22 via the inverters Q23 to Q26 and the charge control line 110a. The gate of the p-type transistor Q21 receives the one-shot pulse signal WEQ, and the gate of the p-type transistor Q22 receives the one-shot pulse signal DEQ.

The write error prevention circuit 210 is controlled by the one-shot pulse signals WEQ and DEQ. The SRAM of the second embodiment operates as shown in FIGS. 3A to 3J. In general, a memory cell array 101 is made up of n-type transistors, and a precharge circuit 108 is made up of p-type transistors.

According to the second embodiment, since the write error prevention circuit 210 is constituted by the p-type transistors Q21, Q22, and Q27 to Q34, it can be easily assembled in the precharge circuit 108. The transistor layout can be easily applied.

Similarly, according to the first embodiment, since the write error prevention circuit 110 is constituted by the n-type transistors Q13 to Q20, it can be easily assembled in the memory cell array 101.

As has been described above, according to the present invention, in a write in the SRAM, the low-level potential of a bit line pair is charged by one-shot pulse signals when a write mode is set and write data is confirmed. This can reduce the power consumed in the memory cell array to prevent a memory cell write error. That is, since no stationary current flows through the write error prevention circuit and bit line to prevent a write error, the power consumption by the stationary current can be reduced.

What is claimed is:

1. A semiconductor memory device comprising:

a memory cell array in which a plurality of memory cells are formed at intersections of pluralities of word lines and bit lines;

a read/write control circuit for controlling a data read/write from/in said memory cell array in accordance with a mode setting signal representing a read/write mode, a data input signal, and an address signal;

a signal generator for generating a one-shot pulse signal when the mode setting signal represents a write mode; and a write error prevention circuit for precharging a bit line of said memory cell array by the one-shot pulse signal from said signal generator.

2. A device according to claim 1, wherein said signal generator generates and outputs a one-shot pulse signal to said write error prevention circuit when the mode setting signal changes from a read mode to a write mode.

3. A device according to claim 1, wherein said signal generator generates and outputs a one-shot pulse signal to said write error prevention circuit when the data input signal changes.

4. A device according to claim 1, wherein said one-shot pulse generator generates and outputs a first one-shot pulse signal to said write error prevention circuit when the mode setting signal changes from a read mode to a write mode, and generates and outputs a second one-shot pulse signal to said write error prevention circuit when the data input signal changes.

5. A device according to claim 4, wherein said write error prevention circuit comprises:

a first transistor which is connected between a power supply line and a control line and has a gate for receiving the first one-shot pulse signal from said one-shot pulse generator;

a second transistor which is connected between the power supply line and the control line to receive the second one-shot pulse signal from said one-shot pulse generator; and a plurality of third transistors which are arranged in correspondence with bit lines, connected between the control line and the bit lines, and have gates connected to the control line.

6. A device according to claim 5, wherein said first and second transistors are p-type transistors, and said third transistors are n-type transistors.

7. A device according to claim 5, wherein said device further comprises a plurality of diodes connected between gates of said first and second transistors and the control line, and said first, second, and third transistors are p-type transistors.

8. A device according to claim 1, wherein said read/write control circuit comprises:

a column address decoder for decoding an address signal and outputting a selection signal for selecting a word line to said memory cell array;

a row address decoder for decoding an address signal and outputting a selection signal for selecting a bit line;

a data buffer for temporarily storing a data input signal serving as data to be written in said memory cell array, and data read out from said memory cell array;

a bit line controller for connecting the selected bit line to said data buffer in accordance with the selection signal from said row address decoder; and a precharge circuit for precharging the bit line in a read.

9. A device according to claim 8, wherein said memory cells are n-type transistors, and said precharge circuit comprises a p-type transistor.

* * * * *